(12) United States Patent
Gramegna et al.

(10) Patent No.: US 8,928,405 B2
(45) Date of Patent: Jan. 6, 2015

(54) POWER AMPLIFICATION CIRCUITS

(75) Inventors: Giuseppe Gramegna, Golfe Juan (FR);
Konstantinos Manetakis, Nice (FR)

(73) Assignee: Cambridge Silicon Radio Limited,
Cambridge (GB)

( * ) Notice: Subject to any disclaimer, the term of this patent is extended or adjusted under 35 U.S.C. 154(b) by 60 days.

(21) Appl. No.: 13/609,190

(22) Filed: Sep. 10, 2012

(65) Prior Publication Data

US 2014/0070884 A1    Mar. 13, 2014

(51) Int. Cl.
*H03F 3/191* (2006.01)

(52) U.S. Cl.
USPC .......................................... 330/195; 330/305

(58) Field of Classification Search
USPC .......................................... 330/195, 276, 305
See application file for complete search history.

(56) References Cited

U.S. PATENT DOCUMENTS

| 3,641,452 | A | * | 2/1972 | Steed | 330/176 |
| 5,781,071 | A | * | 7/1998 | Kusunoki | 330/269 |
| 6,992,543 | B2 | * | 1/2006 | Luetzelschwab et al. | 333/32 |
| 7,129,784 | B2 | | 10/2006 | Bhatti | |
| 8,232,857 | B1 | | 7/2012 | Wright | |
| 8,270,926 | B2 | * | 9/2012 | Roufoogaran et al. | 455/292 |
| 2003/0169113 | A1 | | 9/2003 | Komijani et al. | |
| 2009/0153250 | A1 | | 6/2009 | Rofougaran et al. | |

FOREIGN PATENT DOCUMENTS

| GB | 2456065 | 7/2009 |
| WO | 2013/048891 | 4/2013 |

OTHER PUBLICATIONS

Search Report issued Feb. 12, 2014 in corresponding British application No. 1314754.1.

* cited by examiner

*Primary Examiner* — Steven J Mottola
(74) *Attorney, Agent, or Firm* — Pillsbury Winthrop Shaw Pittman LLP

(57) ABSTRACT

A circuit for amplifying the power of signal, the circuit comprising a power amplifier, a transformer and a load; wherein the transformer comprises a primary inductor and a secondary inductor, the first inductor being coupled to, and capable of being driven by, the power amplifier, and the secondary inductor coupled to, and capable of driving, the load; wherein a first one of the primary and secondary inductors is a variable inductor whose inductance is variable responsive to a control input in order to change the output power of the amplifier.

8 Claims, 5 Drawing Sheets

POWER AMPLIFICATION CIRCUITS

FIELD OF THE INVENTION

The invention relates to the amplification of the power of electrical signals. Circuits for amplifying signal power are included in transmitters for boosting the power of signals that are to be transmitted wirelessly.

BACKGROUND

FIG. 1 is a schematic illustration of a power amplification circuit 10 in a transmitter. As shown, the circuit 10 comprises a power amplifier 12, a balun 14 and an antenna 16.

The power supply connections of the amplifier 12 are indicated 18 and 20. As shown, the amplifier 18 has a power supply voltage of $V_{dd}$. The signal that is to be transmitted from the antenna 16 is presented as a differential signal across the input terminals 22 and 24 of the amplifier 12. The amplifier 12 amplifies that differential signal and outputs it across lines 26 and 28, which form the input to the balun 14.

A balun is a transformer that is designed to convert a differential signal into a single-ended signal (or vice versa in other scenarios). The balun 14 comprises a primary inductor 30 across which is applied the differential signal that is output by the amplifier 12. The balun 14 also comprises a secondary inductor 32 that is linked to the primary inductor 30 by a shared magnetic flux, indicated by the dotted arrows, such that a voltage is induced across the secondary inductor 32. The voltage that is developed across the secondary inductor 32 is the output signal of the balun 14 and is applied across the antenna 16 by means of lines 34 and 36. The voltage that the balun 14 produces across its output terminals 34 and 36 is the voltage that is applied across its inputs 26 and 28 scaled up by a factor of n. That is to say, the balun 14 has a transformation ratio of 1:n. Where the primary inductor has an inductance $L_1$, the secondary inductor has and inductance $L_2$ and the primary and secondary inductors 30 and 32 have a coupling factor of k, then n in the transformation ratio is given by:

$$n = \frac{1}{k}\sqrt{\frac{L_2}{L_1}} \quad [1]$$

If the impedance, from the point of view of the output of the amplifier 12, the effective impedance of the balun 14 and the antenna 16 is $X_E$, then it can be shown that the output power $P_{OUT}$ of the amplifier 12 is:

$$P_{OUT} = \frac{2V_{dd}^2}{\Re[X_E]} \quad [2]$$

In equation 2, $\Re[X_E]$ is the real part of $X_E$. (Classically, $P=V^2/R$, but here the signal is differential so $V=2V_{dd}$ and $R=2\Re[X_E]$.)

Typically, it is required that the output power of a power amplifier in a transmit chain is adjustable. It will be apparent from equation 2 that this adjustability can be achieved in the case of amplifier 12 by altering $V_{dd}$. In the case where a conventional regulator is used to derive $V_{dd}$ from a voltage $V_{BAT}$ supplied by a battery, the regulator could be controlled to adjust $V_{dd}$ in a manner that provides the desired control over $P_{OUT}$. However, associated with the use of a regulator, there would be a power loss $P_{LOSS}$ of:

$$P_{LOSS} = I_{PA}(V_{BAT} - V_{DD}) \quad [3]$$

In equation 3, $I_{PA}$ is the current consumed by the power amplifier 12.

Where power efficiency is a concern, a switched mode power supply (SMPS) could be used instead of a regulator. That is to say, rather than make the magnitude of $V_{dd}$ continuously variable, $V_{dd}$ can be periodically switched from a constant value to zero, for adjustable interludes. However, a SMPS will consume an undesirably large amount of space when implemented on a silicon chip and would still require a large off-chip inductor.

SUMMARY OF THE INVENTION

According to one aspect, an embodiment of the invention provides a circuit for amplifying the power of signal, the circuit comprising a power amplifier, a transformer and a load. The transformer comprises a primary inductor and a secondary inductor, the first inductor being coupled to, and capable of being driven by, the power amplifier, and the secondary inductor coupled to, and capable of driving, the load. A first one of the primary and secondary inductors is a variable inductor whose inductance is variable responsive to a control input in order to change the output power of the amplifier. In such an arrangement, it is possible to control the output power of the amplifier in a relatively simple way, by adjusting the inductance of the variable inductor.

In certain embodiments, the variable inductor comprises a plurality of excludable inductors and a switching arrangement operable to selectively exclude one or more of the excludable inductors from contributing to the variable inductor in order to alter the inductance of the variable inductor.

In certain embodiments, the variable inductor comprises first and second ends and the switching arrangement comprises first and second switching mechanisms connected, respectively, to the first and second ends and the plurality of excludable inductors are connected in parallel between the first and second switching mechanisms.

In certain embodiments, each of the plurality of excludable inductors is a conductive loop whose ends are connected to respective ones of the first and second switching mechanisms.

In certain embodiments, the excludable inductors do not cross each other.

In certain embodiments, the excludable inductors are concentric.

In certain embodiments, a second one of the first and second inductors is nested with the excludable inductors.

In certain embodiments, the first and second switching mechanisms are configured to provide a state in which all of the excludable inductors are connected between the first and second ends.

In certain embodiments, the first and second switching mechanisms are configured to provide a state in which only a subset of the excludable inductors are connected between the first and second ends.

In certain embodiments, the transformer is a balun. In certain embodiments, the load is an antenna.

BRIEF DESCRIPTION OF THE DRAWINGS

By way of example only, certain embodiments of the invention will now be described by reference to the accompanying drawings, in which.

DETAILED DESCRIPTION

Figure 1:
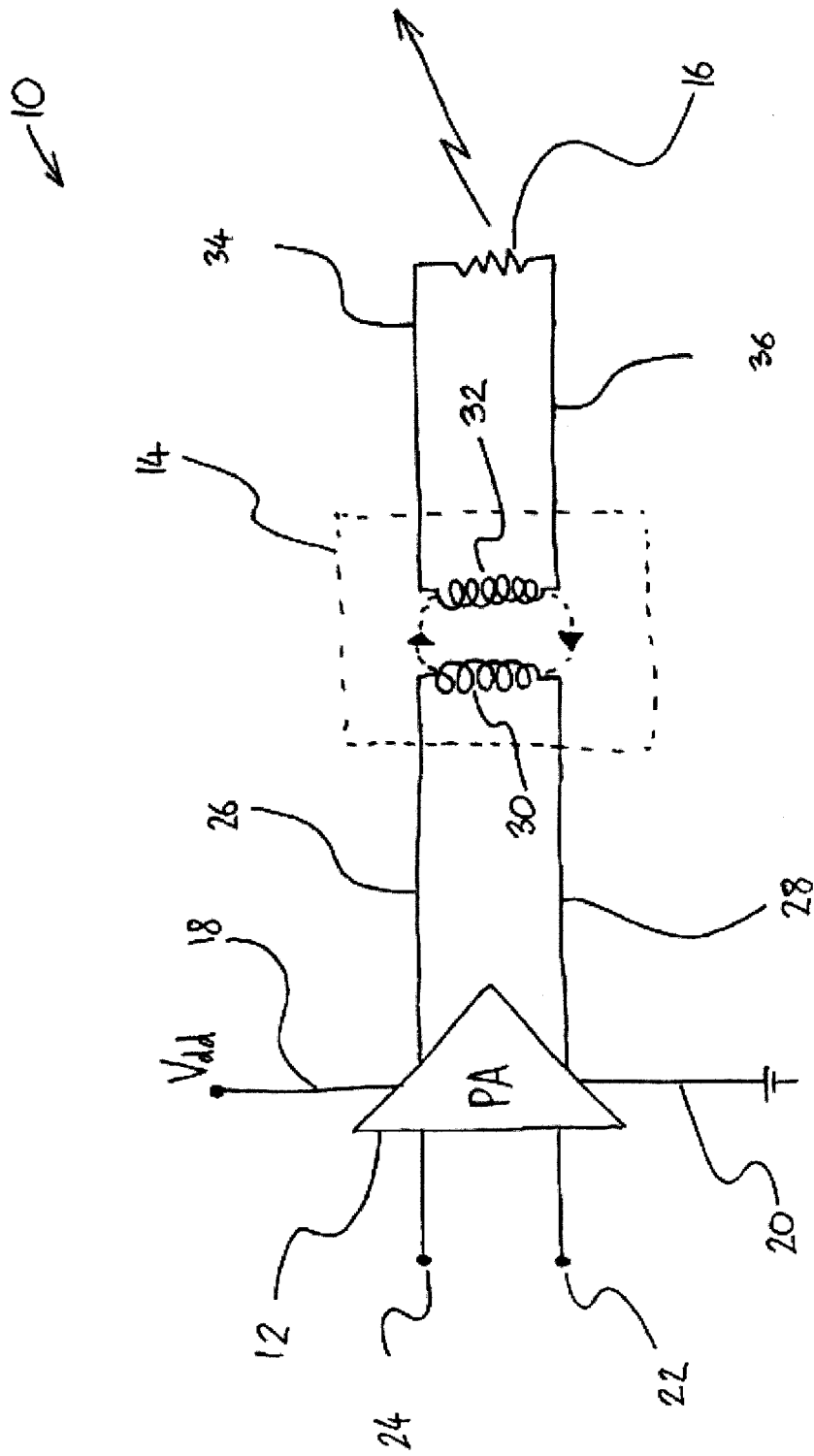
FIG. 1 is a schematic illustration of an amplification circuit.
Figure 2:
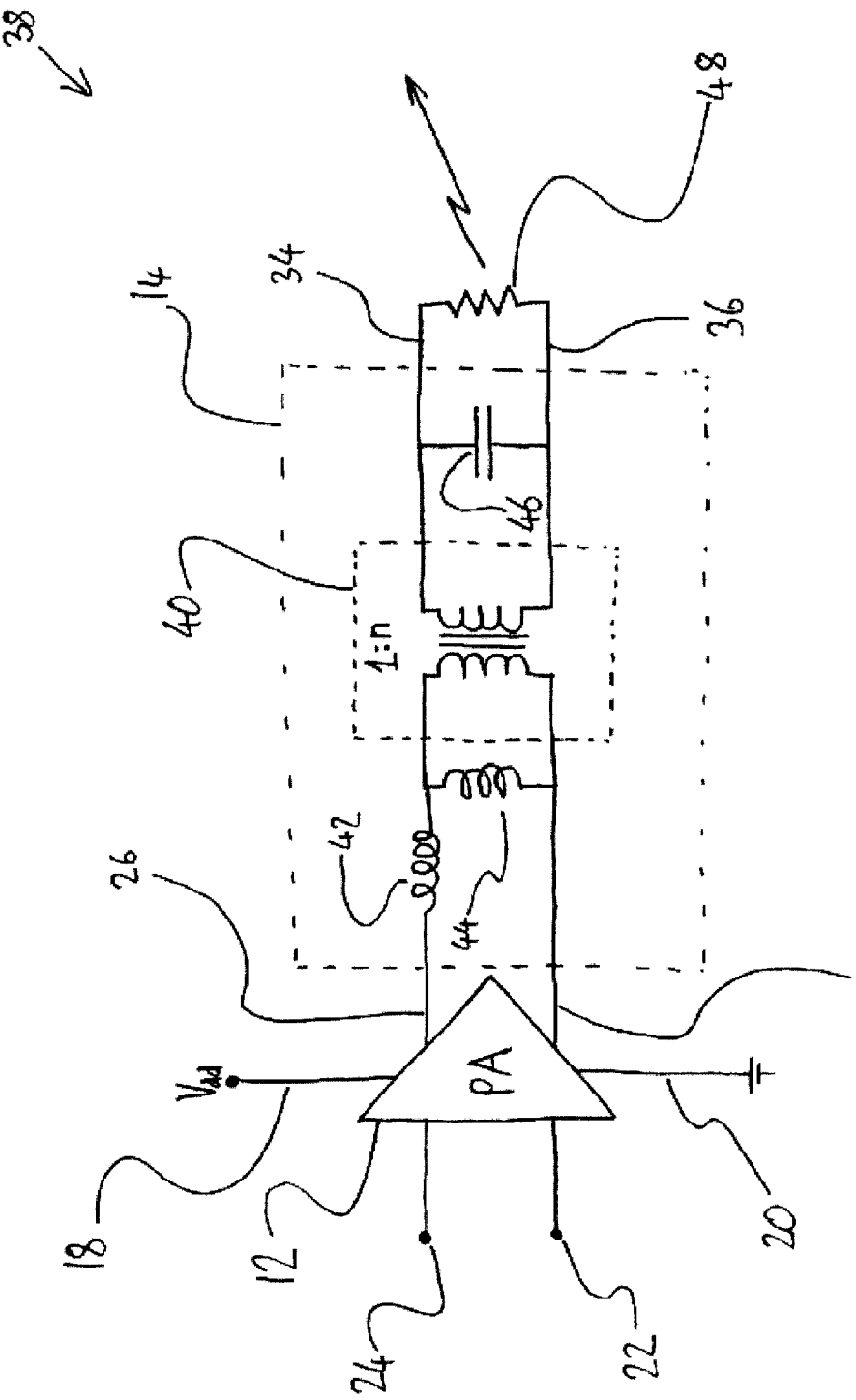
FIG. 2 is an equivalent circuit model for the circuit of FIG. 1.

FIG. 2 shows an equivalent circuit model 38 for circuit 10. Elements that are carried over from FIG. 1 retain the same reference numerals in FIG. 2.

In model 38, the balun 14 is modelled by an ideal (lossless) transformer 40 with a transformation ratio of 1:n, an inductor 42 in series with the input side of the ideal transformer 40, an inductor 44 in parallel with the input side of the ideal transformer 40 and a capacitor 46 in parallel with the output side of the ideal transformer 40. The inductor 42 has an inductance of $(1-k^2)L_1$ and represents the leakage inductance of the primary inductor 30 of the balun 14. The inductor 44 has an inductance of $k^2 L_1$ and represents the magnetization inductance of the primary inductor 30 of the balun 14. The capacitor 46 has a capacitance $C_2$ and represents the stray capacitance of the secondary inductance 32 of the balun 14. The model 38 also represents the antenna 16 as a resistor 48 of resistance $R_L$.

Figure 3:
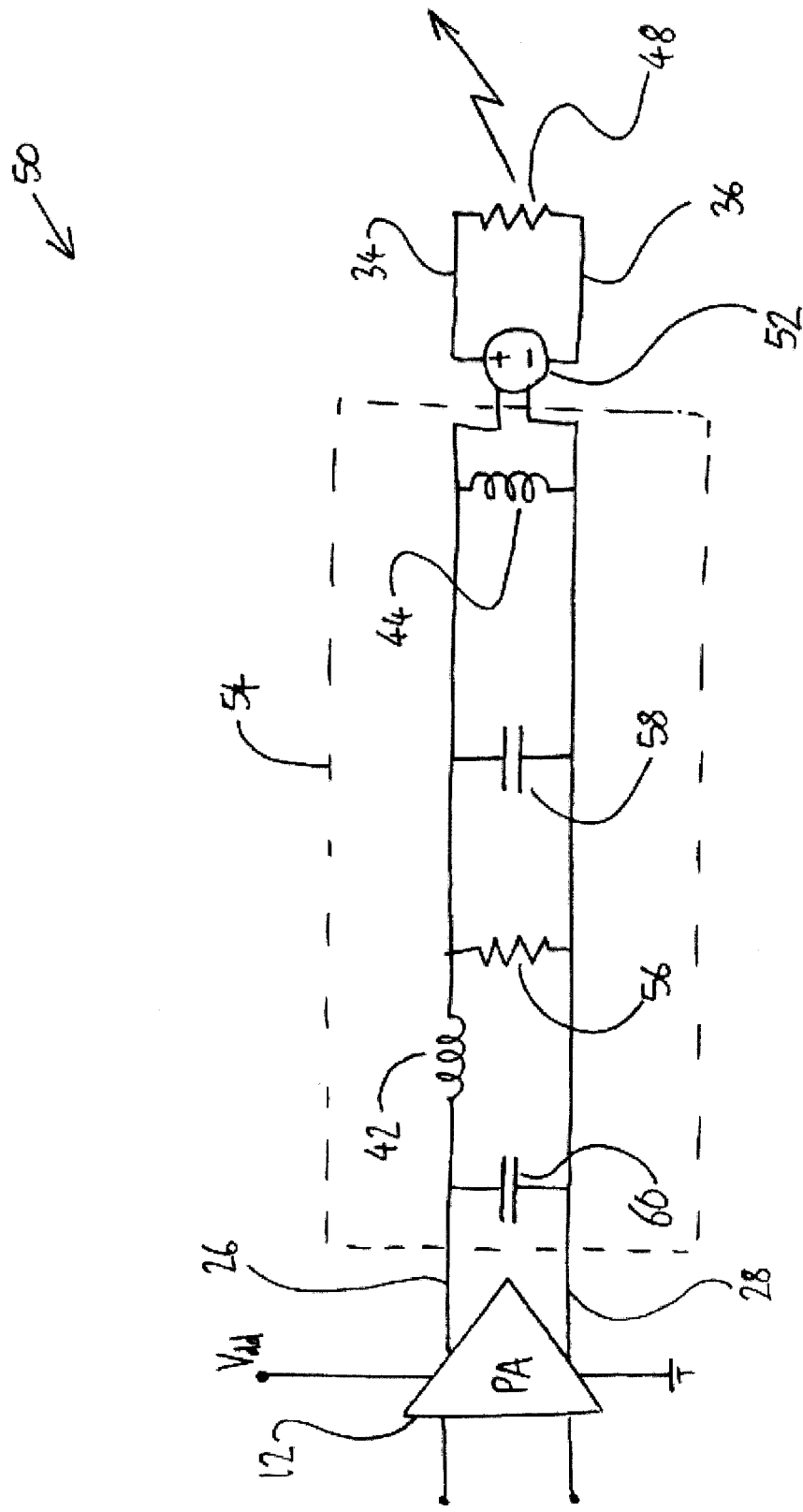
FIG. 3 is an alternative equivalent circuit model for the circuit of FIG. 1.

FIG. 3 shows an alternative equivalent circuit model 50 for circuit 10. Elements that are carried over from FIGS. 1 and 2 retain the same reference numerals in FIG. 3.

Model 50 is derived from model 38 by replacing the ideal transformer 40 with a voltage controlled voltage source 52 whose output voltage is simply connected across the resistor 48 that represents the antenna 16. To compensate for this change to the model, the network 54 representing the primary side of the balun 14 is adjusted by including in parallel with inductor 44 a resistor 56 of resistance $R_L/n^2$ and a capacitor 58 of capacitance $C_2 n^2$. It will also be noted that the model 50 has been augmented by including a capacitor 60 connected across the inputs 26 and 28 of the balun 14. Capacitor 60 has a capacitance $C_1$ and represents the stray capacitance of the primary inductor 30 of the balun 14. It is the impedance of the network 54 that the amplifier 12 sees when driving the antenna 16 via the balun 14. That is to say, the impedance of network 54 is $X_E$.

An expression for $X_E$ can therefore be derived from network 54. There is a resonant frequency, $\omega_o$, of the input signal applied across the inputs 22 and 24 of the amplifier 12, at which that expression becomes simplified, such that its real part is given by:

$$\Re[X_E] = R_L \frac{L_1}{L_2} k^2 + \frac{\omega_o^2 L_2 L_1}{R_L} \left(\frac{1}{k} - k\right)^2 \quad [4]$$

The parasitic capacitances $C_1$ and $C_2$ can be supplemented by additional capacitors (not shown) connected, respectively, across the primary and secondary inductors of the balun 14, in order to alter $\omega_o$ to a desired operating frequency for the amplifier 12.

From equation 4, it will be apparent that the output power of the amplifier 12 can be controlled by adjusting k and $L_1$, since $P_{OUT}=f(X_E)$ and, in turn, $X_E=f(L_1, k)$.

Figure 4:
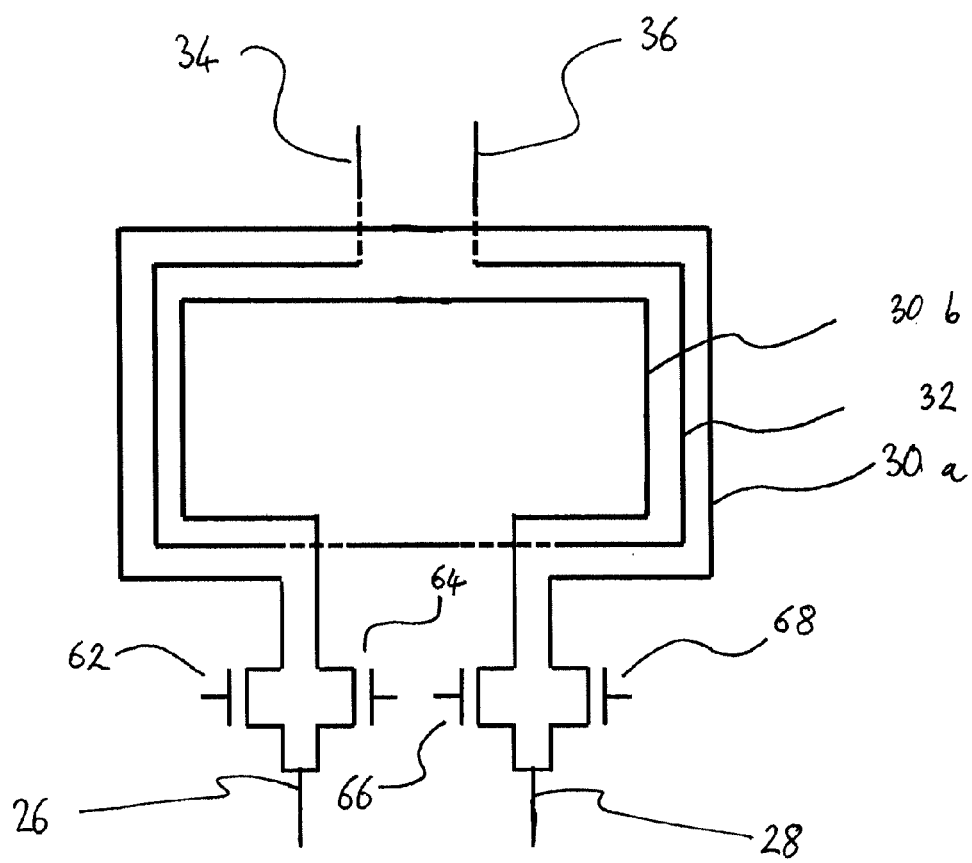
FIG. 4 is an illustration of a balun that can be used in the circuit of FIG. 1.

FIG. 4 schematically illustrates a form for balun 14 in which k and $L_1$ are adjustable for the purpose of controlling the output power of the power amplifier 12. Elements that are carried over from FIGS. 1, 2 and 3 retain the same reference numerals in FIG. 4.

In FIG. 4, the balun 14 is shown in a form that is intended for fabrication on a semiconductor chip. In FIG. 4, the primary and secondary inductors of the balun 14 are provided by conductive tracks laid out in loops. The track providing the secondary inductor is indicated 32 and the output connections 34 and 36 to the antenna are indicated once more. The primary inductor 30, however, is provided by a pair of tracks 30a and 30b. The tracks 30a and 30b are both formed into loops and nested between them is the looped track forming the secondary inductor 32. The track providing the secondary inductor 32 takes on a dashed form where it crosses tracks 30a and 30b. In practice, these crossing points would be constructed using vias. One end of inductor 30a is connected to output 26 of the amplifier 12 by a MOSFET switch 62 and the other end of the inductor 30a is attached to output 28 of the amplifier 12 by a MOSFET switch 68. Similarly, the ends of inductor 30b are attached to outputs 26 and 28 by MOSFET switches 64 and 66, respectively. In practical implementations, switches 62, 64, 66 & 68 can be also conveniently implemented by the cascode devices already present in the PA 12 in FIG. 3. The inductance of the primary inductor 30 and the coupling factor k can be selected by choosing the states of the switches 62 to 68, as will now be explained.

The switches 62 to 68 are restricted to occupying just three states, namely:

a first state in which switches 62 and 68 are closed and switches 64 and 66 are open. In this state, loop 30a alone provides the primary inductor and k is determined by the spatial relationship between loop 30a and inductor 32.

a second state in which switches 62 and 68 are open and switches 64 and 66 are closed. In this state, loop 30b alone provides the primary inductor and k is determined by the spatial relationship between loop 30b and inductor 32.

a third state in which all the switches 62 to 68 are closed. In this state, loops 30a and 30b together provide the primary inductor since they are connected in parallel between the outputs 26 and 28 of the amplifier 12. The coupling factor k is determined by the spatial relationship between loops 30a, 32 and 30b.

Figure 5:
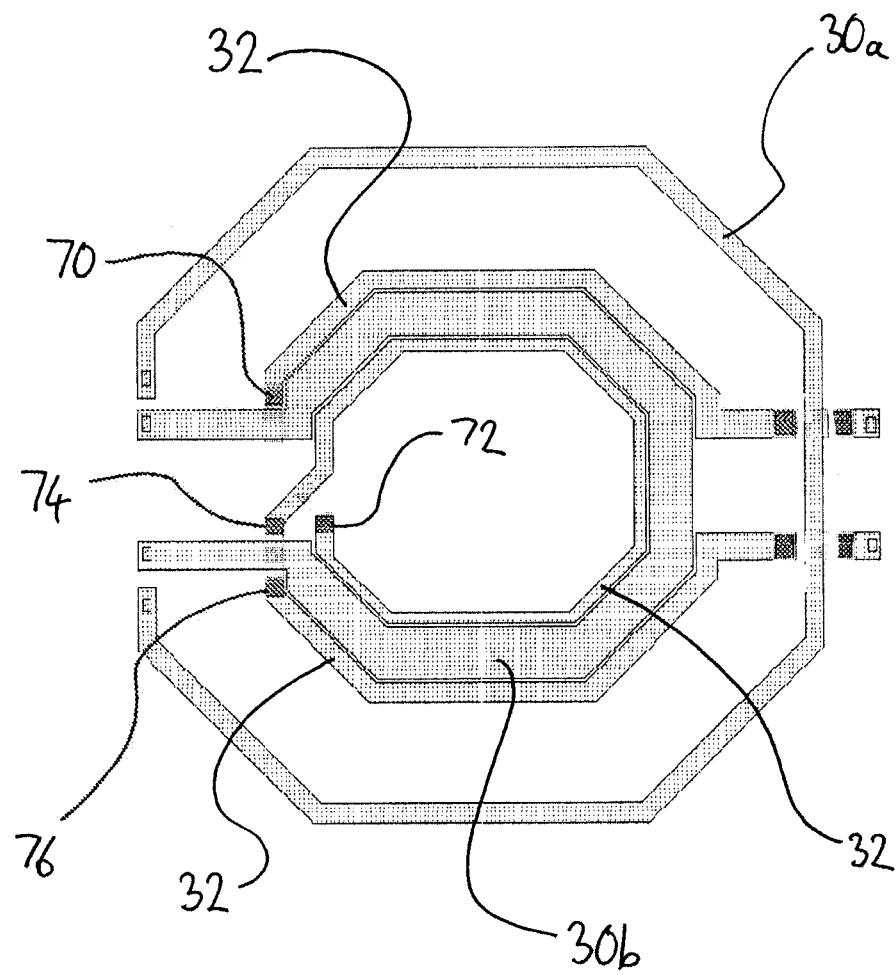
FIG. 5 illustrates an arrangement of conductive tracks that can provide the inductors of the balun shown in FIG. 4.

FIG. 5 illustrates how the tracks making up the inductors of the balun 14 might be laid out in a structure fabricated on a silicon chip in practice. In FIG. 5, the MOSFET switches are omitted for clarity. It will be observed that the secondary inductor 32 includes two turns that run along the periphery of track 30b. This is done in order to increase the coupling factor of loop 30b with the secondary inductor 32. The secondary inductor 32 runs through a lower layer of the structure on the chip between vias 70 and 72 and between vias 74 and 76 so that the turns of the secondary inductor can cross the loop 30b, and each other. This means that the looped tracks 30a and 30b providing the primary inductor can run uninterruptedly on one layer of the structure on the chip, and that layer can be the top metal layer of the chip. This is advantageous in all technologies with a single thick top metal layer capable of carrying high current density with no electromigration problems, since inductors 30a and 30b are the ones that carry a DC constant (in addition to a modulated AC current) while inductor 32 carries just an AC modulated current. Considering that electromigration limits are more stringent with DC current, it is clear that having inductors 30a and 30b run uninterruptedly on the single thick top metal layer of the chip is a significant advantage. Also, the fact that the inductors 30a and 30b can run uninterruptedly means that there is no need for them to include vias, since vias also have electromigration limits.

It will be appreciated that various modifications may be made to the embodiments described herein without departing from the scope of the invention, which is defined by the appended claims.

What is claimed is:

1. A circuit for amplifying the power of a signal, the circuit comprising a power amplifier, a transformer and a load;
   wherein the transformer comprises a primary inductor and a secondary inductor, the primary inductor being coupled to, and capable of being driven by, the power amplifier, and the secondary inductor coupled to, and capable of driving, the load;
   wherein a first one of the primary and secondary inductors is a variable inductor whose inductance is variable responsive to a control input in order to change the output power of the amplifier;
   wherein the variable inductor comprises a plurality of excludable inductors and a switching arrangement operable to selectively exclude one or more of the excludable inductors from contributing to the variable inductor in order to alter the inductance of the variable inductor;
   wherein the variable inductor comprises first and second ends and the switching arrangement comprises first and second switching mechanisms connected, respectively, to the first and second ends and the plurality of excludable inductors are connected in parallel between the first and second switching mechanisms; and
   wherein a second one of the primary and secondary inductors is nested with the excludable inductors.

2. A circuit according to claim 1, wherein each of the plurality of excludable inductors is a conductive loop whose ends are connected to respective ones of the first and second switching mechanisms.

3. A circuit according to claim 2, wherein the excludable inductors do not cross each other.

4. A circuit according to claim 2, wherein the excludable inductors are concentric.

5. A circuit according to claim 1, wherein the first and second switching mechanisms are configured to provide a state in which all of the excludable inductors are connected between the first and second ends.

6. A circuit according to claim 1, wherein the first and second switching mechanisms are configured to provide a state in which only a subset of the excludable inductors are connected between the first and second ends.

7. A circuit according to claim 1, wherein the transformer is a balun.

8. A circuit according to claim 1, wherein the load is an antenna.

* * * * *